United States Patent
Georgantas et al.

(10) Patent No.: US 7,573,410 B1
(45) Date of Patent: Aug. 11, 2009

(54) GAIN STEP CALIBRATION IN A MOBILE CELLULAR TRANSMITTER

(75) Inventors: Theodoros Georgantas, Chaidari (GR); Sofoklis E. Plevridis, Glyfada (GR); Konstantinos D. Vavelidis, Ilioupolis (GR)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 12/042,188

(22) Filed: Mar. 4, 2008

(51) Int. Cl.
*H03M 1/00* (2006.01)
(52) U.S. Cl. ...................................... 341/139; 455/126
(58) Field of Classification Search ......... 341/120–150; 455/126, 324, 303, 234.1, 232.1, 127.2
See application file for complete search history.

(56) References Cited

U.S. PATENT DOCUMENTS

| | | | | |
|---|---|---|---|---|
| 4,943,807 A | * | 7/1990 | Early et al. ................. | 341/120 |
| 5,841,385 A | * | 11/1998 | Xie ............................ | 341/139 |
| 6,278,392 B1 | * | 8/2001 | Nestler ....................... | 341/143 |
| 6,473,016 B2 | * | 10/2002 | Piirainen et al. ............ | 341/139 |
| 6,603,416 B2 | * | 8/2003 | Masenas et al. ............. | 341/120 |
| 6,735,422 B1 | * | 5/2004 | Baldwin et al. .......... | 455/232.1 |
| 6,963,733 B2 | * | 11/2005 | Eriksson et al. ............. | 455/132 |
| 7,289,055 B2 | * | 10/2007 | Kobayashi et al. .......... | 341/161 |
| 7,292,169 B2 | * | 11/2007 | Mori et al. ................... | 341/139 |
| 7,352,310 B2 | * | 4/2008 | Mori et al. ................... | 341/139 |
| 7,492,294 B2 | * | 2/2009 | Rueckriem ................... | 341/139 |
| 7,504,973 B2 | * | 3/2009 | Inagaki ....................... | 341/139 |

* cited by examiner

*Primary Examiner*—Lam T Mai
(74) *Attorney, Agent, or Firm*—Garlick Harrison & Markison

(57) ABSTRACT

A technique to utilize digital gain control to fine adjust gain for one or more analog gain steps of an analog circuit. A gain step calibration procedure is utilized to set the digital gain within acceptable limits established for the analog gain at a particular operating gain level for the analog circuit set by an analog gain step.

18 Claims, 5 Drawing Sheets

GAIN STEP CALIBRATION IN A MOBILE CELLULAR TRANSMITTER

BACKGROUND OF THE INVENTION

1. Technical Field of the Invention

The present invention relates generally to wireless communication systems and, more particularly, to a gain calibration scheme for use in wireless communication devices.

2. Description of Related Art

Mobile communication has changed the way people communicate and mobile phones have been transformed from a luxury item to an essential part of every day life. The use of mobile phones today is generally dictated by social situations, rather than being hampered by location or technology. While voice connections fulfill the basic need to communicate, and mobile voice connections continue to filter even further into the fabric of every day life, the mobile Internet and moving video, including broadcast video, are the next steps in the mobile communication revolution. The mobile Internet is poised to become a common source of everyday information, and easy, versatile mobile access to this data will be taken for granted. Similarly, video transmissions to handheld user equipment will allow movies and television programs to be viewed on the go.

Third generation (3G) cellular networks have been specifically designed to fulfill many, if not all, of these future demands. As these services grow in popularity and usage, factors such as cost efficient optimization of network capacity and quality of service (QoS) will become even more essential to cellular operators than it is today. These factors may be achieved with careful network planning and operation, improvements in transmission methods, and advances in receiver techniques. To this end, carriers want technologies that will allow them to increase downlink throughput and, in turn, offer advanced QoS capabilities and speeds that rival those delivered by cable modem and/or DSL service providers. In this regard, networks based on Code Division Multiple Access (CDMA) technology or Wideband Code Division Multiple Access (WCDMA) technology may make the delivery of data to end users a more feasible option for today's wireless carriers.

The General Packet Radio Service (GPRS) and Enhanced Data rates for GSM (EDGE) technologies may be utilized for enhancing the data throughput of present second generation (2G) systems such as GSM. The Global System for Mobile telecommunications (GSM) technology may support data rates of up to 14.4 kilobits per second (Kbps), while the GPRS technology may support data rates of up to 115 Kbps by allowing up to 8 data time slots per time division multiple access (TDMA) frame. The GSM technology, by contrast, may allow one data time slot per TDMA frame. The EDGE technology may support data rates of up to 384 Kbps. The EDGE technology may utilizes 8 phase shift keying (8-PSK) modulation for providing higher data rates than those that may be achieved by GPRS technology. The GPRS and EDGE technologies may be referred to as "2.5G" technologies.

The Universal Mobile Telecommunications System (UMTS) technology with theoretical data rates as high as 2 Mbps, is an adaptation of the WCDMA 3G system by GSM. One reason for the high data rates that may be achieved by UMTS technology stems from the 5 MHz WCDMA channel bandwidths versus the 200 KHz GSM channel bandwidths. The High Speed Downlink Packet Access (HSDPA) technology is an Internet Protocol (IP) based service, oriented for data communications, which adapts WCDMA to support data transfer rates on the order of 10 megabits per second (Mbits/s). Developed by the 3G Partnership Project (3GPP) group, the HSDPA technology achieves higher data rates through a plurality of methods.

Where HSDPA is a downlink protocol, High Speed Uplink Packet Access (HSUPA) technology addresses the uplink communication. HSUPA is also specified by the 3GPP group to provide a complement data link to HSDPA. HSUPA also offers broadband IP and is based on software. HSUPA also extends the WCDMA bit rates, but the uplink rates may be less than the downlink rates of HSDPA. Where prior protocols severely limited the uplink connections, HSUPA allows for much higher uplink rates.

Likewise, standards for Digital Terrestrial Television Broadcasting (DTTB) provide for transmission of broadcast video. Three leading DTTB systems are the Advanced Television Systems Committee (ATSC) system, the Integrated Services Digital Broadcasting-Terrestrial (ISDB-T) system, and the Digital Video Broadcasting (DVB) system, which includes terrestrial transmission under Digital Video Broadcasting-Terrestrial (DVB-T) specifications and transmissions to handheld devices under Digital Video Broadcasting-Handheld (DVB-H) specifications. DVB-H is an adaptation of DVB-T to handheld units, in which additional features are implemented to meet specific requirements of handheld units. DVB-H allows downlink channels with high data rates and may be made as enhancements to current mobile wireless networks. DVB-H may use time slicing technology to reduce power consumption of handheld devices.

In order to practice the various communication protocols, a wireless communication device is utilized. For a wireless communication device to participate in wireless communication, it typically includes a built-in radio transceiver (i.e., receiver and transmitter) or is coupled to an associated radio transceiver (e.g., a station for in-home and/or in-building wireless communication networks, RF modem, etc.). The transmitter typically includes a data modulation stage, one or more intermediate frequency (IF) stages, and a power amplifier. The data modulation stage converts raw data into baseband signals in accordance with a particular wireless communication standard. The one or more IF stages mix the baseband signals with a local oscillator signal to produce radio frequency (RF) signals. The power amplifier amplifies the RF signals prior to transmission via an antenna.

The receiver is coupled to an antenna and typically includes a low noise amplifier, one or more intermediate frequency stages, a filtering stage, and a data recovery stage. The low noise amplifier receives inbound RF signals via the antenna and amplifies them. The one or more IF stages mix the amplified RF signals with a local oscillator signal to convert the amplified RF signal into baseband signals or IF signals. The filtering stage filters the baseband signals or the IF signals to attenuate unwanted out of band signals to produce filtered signals. The data recovery stage recovers raw data from the filtered signals in accordance with the particular wireless communication standard.

In a typical RF front end, components closest to the antenna in a transmitting path are generally analog components. Thus, after a digital-to-analog conversion of a transmit signal, the analog signal is coupled through analog components, such as an analog filter, mixer, one or more drivers and a power amplifier. There may be other stages as well. Further, one or more of these components may have variable gain properties in order to adjust the gain of the signal at various stages of the transmitting path. For analog stages (which may have one or more analog cells), the gain is controlled by use of analog gain schemes, in which one or more analog cells have the analog gain adjusted. For example, transistors or passive components (such as resistors) may be switched in or out within an analog circuit to adjust the gain of a particular analog cell.

However, the use of analog gain control with these components may have some disadvantages when it comes to performance. Although analog stages are typically calibrated at the factory based on some performance parameter, such as maximum output power, high accuracy may be difficult to obtain in these analog stages since the granularity between the discrete analog gain steps may be limited by the analog components themselves. That is, analog gain adjustments of analog circuitry in many RF front ends lack fine adjustment steps in controlling the gain. Gain adjustments in the analog stages may be so coarse that fine adjustments of the gain may not be possible by use of analog means only.

Furthermore, gain control in the various analog stages may be further limited due to the presence of a plurality of analog cells. For example, if sufficient manufacturing or operating variations are present, there may be poor gain stability among the cells, due to temperature, process or power supply variations, so that fine tracking of the gain among the stages may be difficult to obtain for all operating conditions. Other problems may be present as well. Thus, it would be advantageous to implement a digital control of gain in the analog cells, in which the digital gain control of analog stages may provide a smaller incremental step in adjusting the gain.

Therefore, a need exists for a technique to use the existing analog gain adjustment circuitry, but to provide a digital gain control that allows for a finer granularity in adjusting the gain for improved performance. With the implementation of the digital gain adjustment, a calibration scheme may also be implemented to use the finer digital gain adjustment to compensate for variations in the analog gain values at one or more of the analog gain steps.

SUMMARY OF THE INVENTION

The present invention is directed to apparatus and methods of operation that are further described in the following Brief Description of the Drawings, the Detailed Description of the Embodiments of the Invention, and the Claims. Other features and advantages of the present invention will become apparent from the following detailed description of the embodiments of the invention made with reference to the accompanying drawings.

DETAILED DESCRIPTION OF THE EMBODIMENTS OF THE INVENTION

The embodiments of the present invention may be practiced in a variety of settings that utilize a wireless communication transceiver. The specific embodiments described below pertain to a calibration scheme used with an analog gain step to set gain of a transmitter within a RF front end of a wireless device, such as a cellular device. However, the invention need not be limited to such applications and different embodiments of the invention may be implemented in other circuitry and used in other applications. For example, embodiments of the invention may be readily adapted for calibrating analog gain associated with the receiver side of the wireless device.

Figure 1:
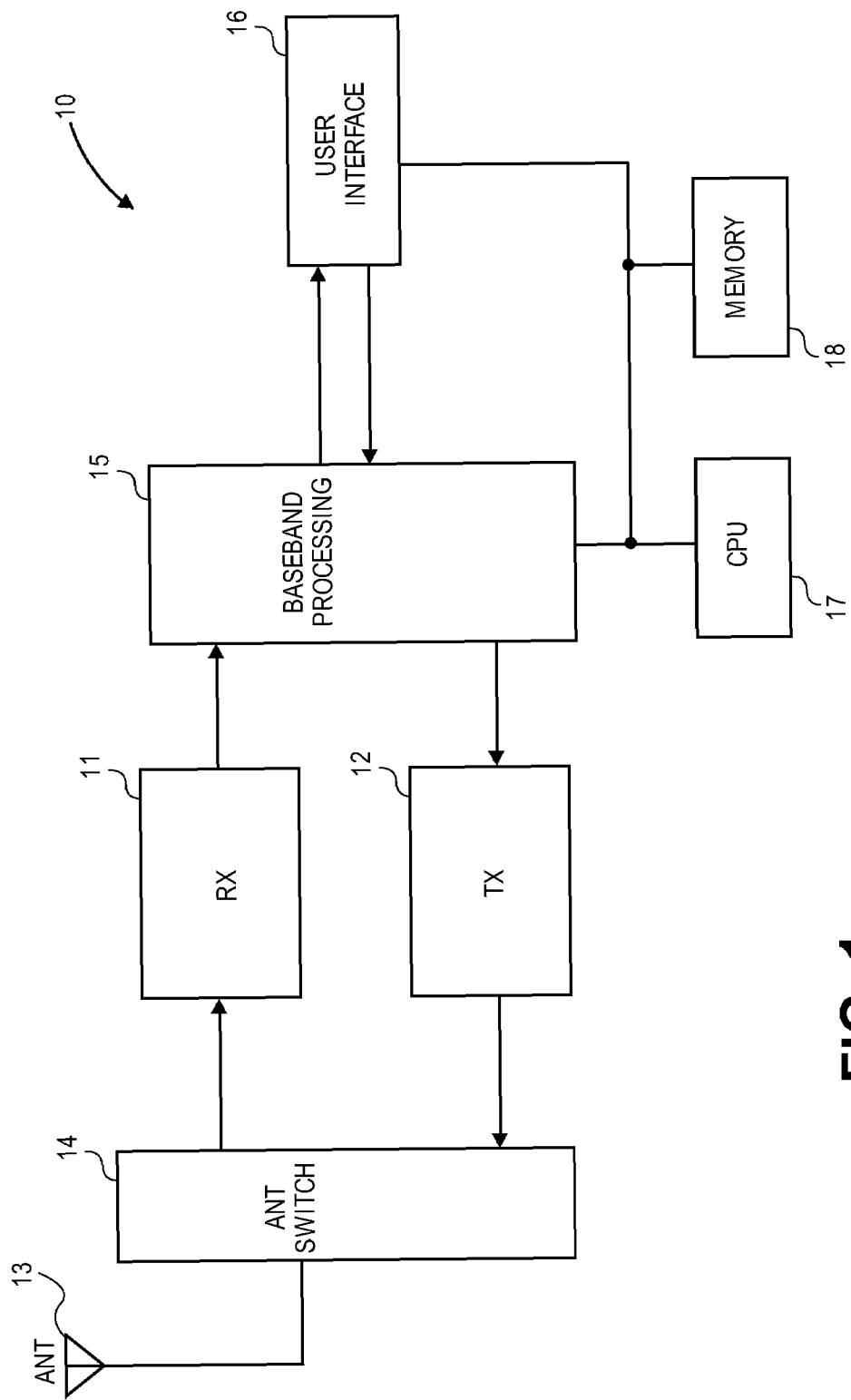
FIG. 1 is a block diagram showing an exemplary downlink device used in a wireless communication system.

FIG. 1 shows a wireless device 10 which is used in a wireless communication system. Device 10 may be of a variety of wireless devices for sending and receiving data. As such, device 10 may be a computing device, a routing device, a communication device, etc. In one instance, device 10 may be used as a user terminal or user equipment (UE) for communicating with an uplink device. Device 10 may be a cell phone for receiving and/or sending audio communication, text messaging and other data. Device 10 may also receive and/or send packet traffic for communications through the Internet, or some other network. Device 10 may also receive and/or send video data. In other instances, device 10 may receive moving video and/or broadcast transmissions, such as broadcast television. Device 10 may be used in a computer, such as a desktop computing unit or a laptop computing unit. What is to be noted is that device 10 may operate to receive a variety of signals transmitted from another device and the received signal depends on the particular environment of the communication system that device 10 operates in. Furthermore, device 10 may transmit signals to another device. In one embodiment, device 10 may be a downlink device, such as a cell phone or some other handheld device that is operated by a user, in which case device 10 may transmit signals to an uplink device.

Device 10 includes receiver (RX) 11 and transmitter (TX) 12 that are coupled to an antenna 13, via switch 14. Switch 14 may take many forms and may implement different radio frequency (RF) switching technology. Switch 14 may include transmit/receive (T/R) switching circuitry and/or duplexers, etc. What is to be noted is that some form of switching and/or duplexing may be implemented between antenna 13 and the RF front end of device 10. In some instances antenna 13 may comprise multiple antennas. Receiver 11 includes suitable circuitry to receive and convert inbound RF signals to inbound baseband signals. Likewise, transmitter 12 includes suitable circuitry to convert outbound baseband transmit signals to outbound RF signals for transmission from antenna 13.

Device 10 also includes a baseband processing module 15 and user interface 16. Baseband processing module 15 is coupled to receiver 11 to process the converted inbound signals from receiver 11 and to provide an output to the user of the device through interface 16. Similarly, user inputs at interface 16 are coupled to baseband processing module 15 and outbound signals for transmission are coupled to transmitter 12. User interface 16 may take various forms including, but not limited to, a video display, keyboard, microphone, headphones and/or speakers. Baseband processing module generally performs baseband operations in signal processing for received signals and likewise for signals to be transmitted.

Device 10 may also include a general (or host) processor 17 to control various processing operations of device 10, including control functions for interface 16 and baseband processing module 15. Processor 17, in some applications, is referred to as a Central Processing Unit (CPU). A memory component 18, which may be an internal memory or an add-on memory, may be included to operate with processor 17. It is to be noted that a variety of storage devices may be implemented for memory 18. Processor 17 is shown coupled to baseband processing module 15 and user interface 16, but other connections are possible to various components of device 10 in other embodiments.

As noted above, device 10 is a wireless device and in one embodiment, device 10 operates as a downlink transceiver for receiving and sending communication signals. In one embodiment, device 10 is operated as a handheld terminal in a communication link. In particular, device 10 may operate within a cellular environment. Although a variety of receivers and transmitters (transceivers) may be implemented for RX 11 and TX 12, one particular embodiment is illustrated in FIG. 2.

Figure 2:
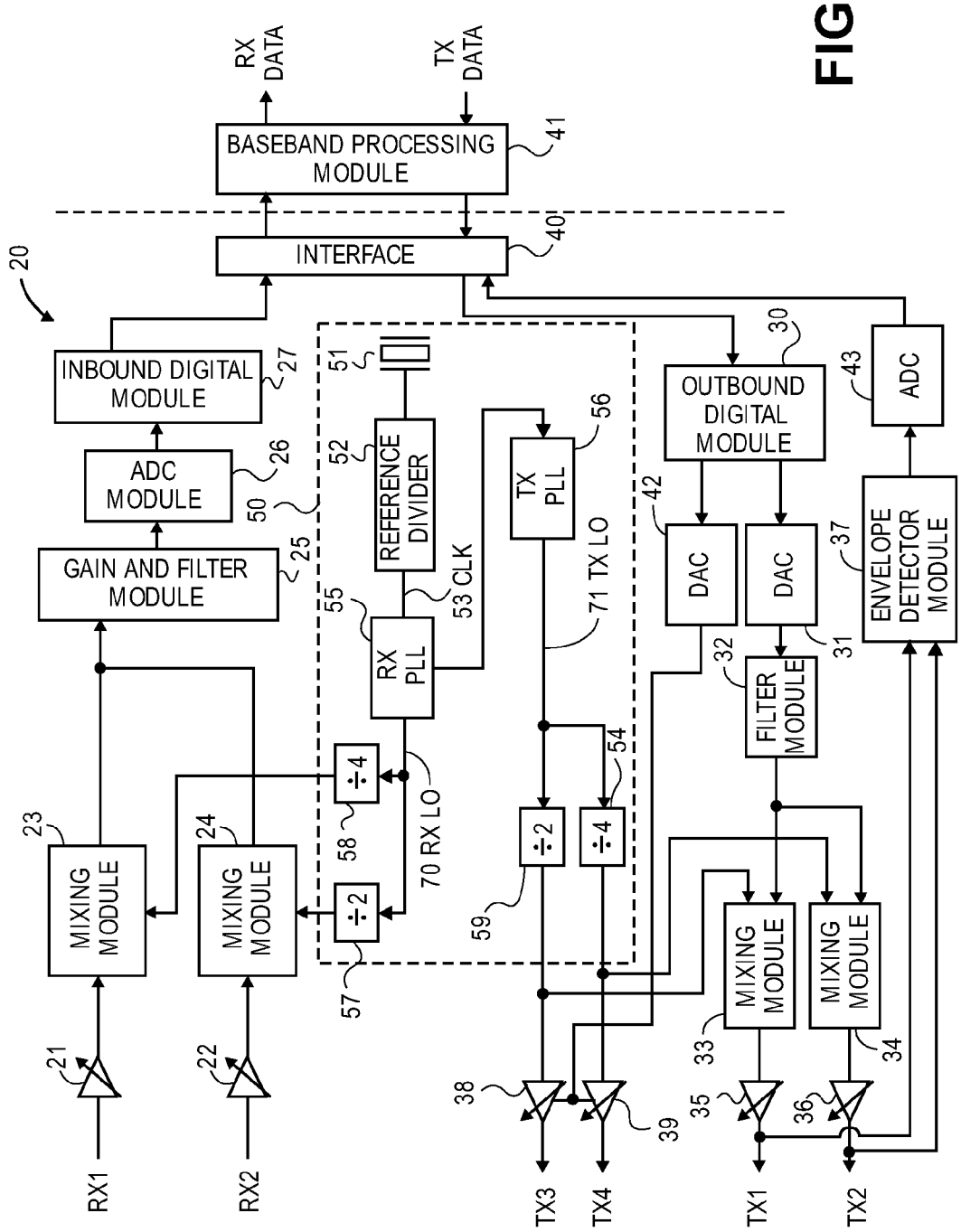
FIG. 2 is a block schematic diagram of an exemplary RF front end of a wireless device that implements an embodiment of a gain step calibration scheme of the present invention to use digital gain control for an analog gain step in an analog stage of a transmitter.

FIG. 2 shows a single-chip multiple-band RF transceiver that may be implemented in a RF front end of a variety of wireless devices, including device 10 of FIG. 1. In one embodiment, transceiver stage 20 is constructed on a single integrated circuit (IC). A baseband interface 40 couples transceiver stage 20 to a baseband processing module 41. Baseband processing module 41 may be utilized for baseband processing module 15 of FIG. 1. Furthermore, baseband processing module 41 may be constructed on the same IC as transceiver stage 20. Alternatively, baseband processing module 41 may be constructed on a separate IC.

The receiver side of transceiver stage 20 includes a first low-noise amplifier (LNA) module 21, second LNA module 22, first receiver mixing module 23, second receiver mixing module 24, gain and filter module 25, analog-to-digital converter (ADC) 26 and inbound digital module 27. The transmitter side of transceiver stage 20 includes an outbound digital module 30, first digital-to-analog converter (DAC) 31, a second DAC 42, filter module 32, first transmitter mixing module 33, second transmitter mixing module 34, first power amplifier (PA) module 35, second PA module 36, third PA module 38, fourth PA module 39, an envelope detector module 37 and an analog-to-digital converter (ADC) 43. It is to be noted that any or all of PA modules 35, 36, 38, 39 may be the power amplifier itself or a driver that drives a power amplifier, including a power amplifier that resides off-chip.

Envelope detector module 37 is shown coupled to the output of PA modules 35, 36, but in actual practice, it may be coupled to just one PA module 35 or 36, or to both PA modules. In other embodiments, separate envelope detector modules may be used. Although not shown, outputs of PA modules 38 and/or 39 may be coupled to one or more envelope detector modules as well or even to envelope detector module 37. Further, it is to be noted that although a specific number of LNA modules and PA modules are noted, there may be more such units in other embodiments, while in other embodiments there may only be one LNA and/or PA. Furthermore, LNA modules are hereinafter simply referred to as LNAs and PA modules are simply referred to as PAs. Similarly, envelope detector module 37 is also hereinafter simply referred to as an envelope detector.

In the particular embodiment of FIG. 2, multiple LNAs are used so that each LNA 21, 22 operates on a selected set or band of receiving frequencies. Similarly, multiple PAs are used so that each PA (or PA driver) operates on a selected set or band of transmitting frequencies. Thus, inbound RF input to LNA 21 is designated as RX1 and RF input to LNA 22 is designated as RX2. RX1 and/or RX2 may each be a single band or multiple band of frequencies. Outbound RF signals for transmission are noted as TX1, TX2, TX3 and TX4, which correspond to outputs from PAs 35, 36, 38, 39, respectively. TX1, TX2, TX3 and TX4 may each be a single band or multiple band of frequencies as well.

Although the range of frequencies operated on by each LNA varies from embodiment to embodiment, in one implementation, LNA 21 accepts one set of signals within a frequency band that is at approximately 700 to 800 MHz and accepts a second set of signals within a frequency band that is at approximately 900 MHz. Also with this embodiment, LNA 22 accepts signals within three separate frequency bands, where the bands are noted at approximately 1800 MHz, 1900 MHz and 2100 MHz. Additional LNAs may also be used to cover other bands, such as the 1500 MHz and the 2500 MHz bands. Any or all LNAs may be respectively used to operate at the Long Term Evolution (LTE) protocol.

It is to be noted that some frequency bands may be set standards and a given band may be identified by a single frequency designation. For example, a frequency band at 700 to 800 MHz may actually refer to frequencies in a range of 730-894 MHz. Likewise, a frequency band at 900 MHz may actually refer to frequencies in a range of 880-915 MHz or 925-960 MHz. Some of the frequency ranges may depend on whether the communication of the particular band is uplink communication or downlink communication. Typically, these frequency bands define a range of frequencies for a particular communication protocol that is being used The PAs also operate in a like manner, wherein each operates to transmit signals in one or more band of frequencies. Thus, in the described example embodiment, PA 38 outputs signals within two separate frequency bands, where a first band is at approximately 1800 MHz and a second band is at approximately 1900 MHz. PA 39 is used to output signals within two separate frequency bands, where the one band is at approximately 850 MHz and the other band is at approximately 900 MHz. Likewise, PA 36 outputs signals within two frequency bands, where one band is at approximately 850 MHz and the other band is at approximately 900 MHz. PA 35 outputs signals within three frequency bands, where a first band is at approximately 1800 MHz, a second band is at approximately 1900 MHz and a third band is at approximately 2100 MHz. Additional PAs may also be used to cover the frequency bands at 1500 MHz and 2500 MHz. As noted above, these frequency bands define a range of frequencies for a particular communication protocol that is being used. Furthermore, in one embodiment, PAs 38, 39 are operable for GSM/EDGE signal transmissions, while PAs 35, 36 are operable for WCDMA transmissions. The additional PAs may be used to cover recently assigned bands at 1500 MHz and 2500 MHz. Apart from the GSM/EDGE and CDMA/WCDMA protocols, they may be also used to operate at the LTE protocol. It is to be noted that other embodiments may have different frequency band schemes and those described herein are examples of particular embodiments of the invention.

Although not shown in detail, it is to be noted that the antenna circuitry, as noted by antenna 13 and antenna switch 14 in FIG. 1, may be comprised of one or more antennas, duplexers, switches, transmission lines, transformer baluns, impedance matching networks, filters (such as a Surface Acoustic Wave or SAW filter) and/or tuners to operate on and transfer the various band(s) of received signals from the antenna(s) to the appropriate LNA and transfer the various PA output signals to the antenna(s) for transmission. Furthermore, the signals may take various forms, including but not limited to GSM, EDGE, CDMA, WCDMA, GMSK (Gaussian Minimum-Shift Keying), 2-GMSK, 4-GMSK, 8-PSK (Phase-Shift Keying), MSK (Minimum-Shift Keying), FSK (Frequency-Shift Keying), ASK (Amplitude-Shift Keying), QPSK (Quadrature Phase-Shift Keying), QAM (Quadrature Amplitude-Shift Keying), BPSK (Binary Phase-Shift Keying) and 8-PSK, just to name a few.

The received signal RX1 is amplified by LNA 21 and down-converted in mixing module 23. Likewise, the received signal RX2 is amplified by LNA 22 and down-converted in mixing module 24. The outputs of the two receiver mixing modules 23, 24 are coupled to gain and filter module 25 for gain adjustment and filtering of the signal and subsequently converted to digital format in ADC module 26. It is to be noted that although one receive path is shown in FIG. 2 between the modules, in actuality separate paths exist for the in-phase (I) component and the quadrature (Q) component. The I and Q outputs from ADC module 26 are coupled to inbound digital module 27, which provides further processing prior to coupling the received signals to baseband processing module 41, via interface 40. The receive output from baseband processing module is shown as RX DATA. Additionally, it is to be noted that inputs and outputs from various components on the receive path may be single-ended or differential.

The transmitter side operates in reverse. Baseband processing module 41 receives TX DATA and provides the baseband processing. The outbound signal which is to be converted and transmitted is sent to outbound digital module 30 via interface 40. Although other embodiments may have different transmitting paths, in this particular embodiment, one set of signals are sent to PAs 38, 39 via DAC 42 to generate TX3 and/or TX4. A second set of signals are sent to PAs 35, 36 via DAC 31 to generate TX1 and/or TX2. This second path utilizes a filter module 32 to filter the analog signal out of DAC 31. In one embodiment, a reconstruction and smoothing filter is used. The output of filter module 32 is coupled to mixing modules 33, 34, depending on the frequency of the output. The output of mixing module 33 is coupled to PA 35 to output TX1 and output of mixing module 34 is coupled to PA 36 to output TX2.

As noted above, although one line is shown in FIG. 2 between the modules in each transmitting path, in actuality separate paths exist for the I and Q components from outbound digital module 30 to the PAs. Furthermore, as noted above, the particular embodiment shown is operable to transmit TX3 and TX4 signals as GSM/EDGE signal transmissions, while TX1 and TX2 signals are WCDMA transmissions. Additionally, it is to be noted that inputs and outputs from various components on the transmit path may be single-ended or differential.

Furthermore, it is to be noted that baseband processing module 41 may perform a variety of processing at the baseband level, including but not limited to one or more of scrambling, encoding, constellation mapping, modulation, frequency spreading, frequency hopping, beamforming, space-time-block encoding, space-frequency-block encoding, and/or digital baseband to IF conversion to convert the outbound signal. Depending on the desired formatting of the outbound signal, the baseband processing module 41 may generate the outbound signal as Cartesian coordinates (e.g., having an in-phase signal component and a quadrature signal component to represent a symbol), as Polar coordinates (e.g., having a phase component and an amplitude component to represent a symbol), or as hybrid coordinates.

In addition, it is to be noted that baseband processing module 41 also converts the inbound signal by performing a variety of processing at the baseband level, including but not limited to, one or more of descrambling, decoding, constellation demapping, modulation, frequency spreading decoding, frequency hopping decoding, beamforming decoding, space-time-block decoding, space-frequency-block decoding, and/or IF to digital baseband conversion to convert the inbound signal.

As further described below, envelope detector 37 receives a sample of the output power from one or a plurality of PAs and detects the signal envelope to determine the signal power content of the RF output. The envelope detection information is converted to digital format by ADC 43 and the information is feedback to baseband processing module 41 via interface 40.

In order to generate local oscillator signals for performing signal conversion, transceiver stage 20 also includes a local oscillator generator module (LO GEN) 50. LO GEN 50 includes a reference clock source, which in this example embodiment is a reference crystal 51. Crystal 51 operates as a clock reference and a particular clock frequency is selected for the reference clock for LO GEN 50. This reference clock is first coupled through a reference divider 52 and then the divided reference clock (CLK) signal 53 of lower frequency is coupled as input to a reference input of a receiver (RX) PLL 55. It is to be noted that although divider 52 is shown in FIG. 2, in other embodiments, there may not be such a divider 55, so that the reference clock frequency is coupled as input to PLL 55 without any frequency division.

Subsequently, PLL output from RX PLL 55 provides a receiver local oscillator (RX LO) signal 70 and this RX LO signal is coupled through divider 57 and then to mixing module 24 as a first divided RX LO signal. The RX LO signal is also coupled through divider 58 and then to mixing module 23 as a second divided RX LO signal. In the particular embodiment shown, divider 57 is a divide-by-two (÷2) divider, while divider 58 is a divide-by-four (÷4) divider. Thus, in the shown embodiment, divider 57 divides RX LO signal 70 by a factor of two for down conversion of the received signal RX2 in mixing module 24, while divider 58 divides RX LO signal 70 by a factor of four for down conversion of the received signal RX1 in mixing module 23.

An output from RX PLL 55 is also coupled to a reference input of TX PLL 56. The signal output from RX PLL 55 to TX PLL 56 may be the RX LO signal 70 or a frequency scaled signal obtained from a feedback path of RX PLL 55. TX PLL 56 generates a TX LO signal 71 at its output and this TX LO signal 71 is coupled through a divider 59 to generate a first divided TX LO signal. TX LO signal 71 is also coupled through a divider 54 to generate a second divided TX LO signal. The first divided TX LO signal is coupled to mixing module 33 and PA 38, while the second divided TX LO signal is coupled to mixing module 34 and PA 39. In the particular embodiment shown, divider 59 is a divide-by-two (÷2) divider, while divider 54 is a divide-by-four (÷4) divider. Thus, in the shown embodiment, divider 59 divides TX LO signal 71 by a factor of two for up conversion to generate transmit signals TX1 and TX 3, while divider 54 divides TX LO signal 71 by a factor of four for up conversion to generate transmit signal TX2 and TX4.

It is to be noted that the particular embodiment of FIG. 2 shows two pairs of PAs. PAs 38, and 39 receive one set of outbound signals after being converted to digital format by DAC 42. This is an amplitude component (AM) signal that is modulated with the divided TX LO signal in PAs 38, 39. In one embodiment, this technique is used to generate outbound RF signals for GSM/EDGE communication protocol. The divided TX LO signals are also provided to mixing modules 33, 34 for direct conversion of another set of outbound signals in which the LO signals are modulated by the outbound signal. In one embodiment, this technique is used to generate outbound RF signals for WCDMA communication protocol.

In reference to the two PLLs shown in FIG. 2, it is to be noted that a variety of PLL circuits may be used. In a typical PLL, the output of the PLL is feedback to the input and the two frequencies are compared to generate an error (correction) signal that is a measure of their phase difference. This error signal is then used to adjust the output to the correct frequency. Generally, a reference input is coupled to a phase/frequency detector (PFD)-charge pump to measure the phase difference of the two inputs and generate an error signal. A low-pass filter is used to filter the error signal, which is then coupled to a voltage controlled oscillator (VCO) to adjust the VCO output. Aside from providing an output from the PLL, the VCO output is fed back to the PFD-charge pump. In some instances, a divider (or prescaler) is placed in the feedback loop to scale the feedback frequency.

Furthermore, it is to be noted that although an output from RX PLL 55 provides the reference input to TX PLL 56, in other embodiments, the opposite may be implemented. That is, an output from TX PLL 56 may provide the reference input to RX PLL 55. Still in other embodiments, inputs to both PLLs 55, 56 may be obtained from the reference crystal 51 or some other reference clock source, so that both PLLs 55, 56 operate independently from one another.

Additionally, in the particular embodiment shown, dividers 57, 58, 59, 54 are shown as fixed dividers. That is, the divisor for each divider is fixed. However, in some embodiments, one, some or all of these dividers may be programmed to adjust the divisor value(s), so that the frequency division may be adjusted and/or switched programmably.

Figure 3:
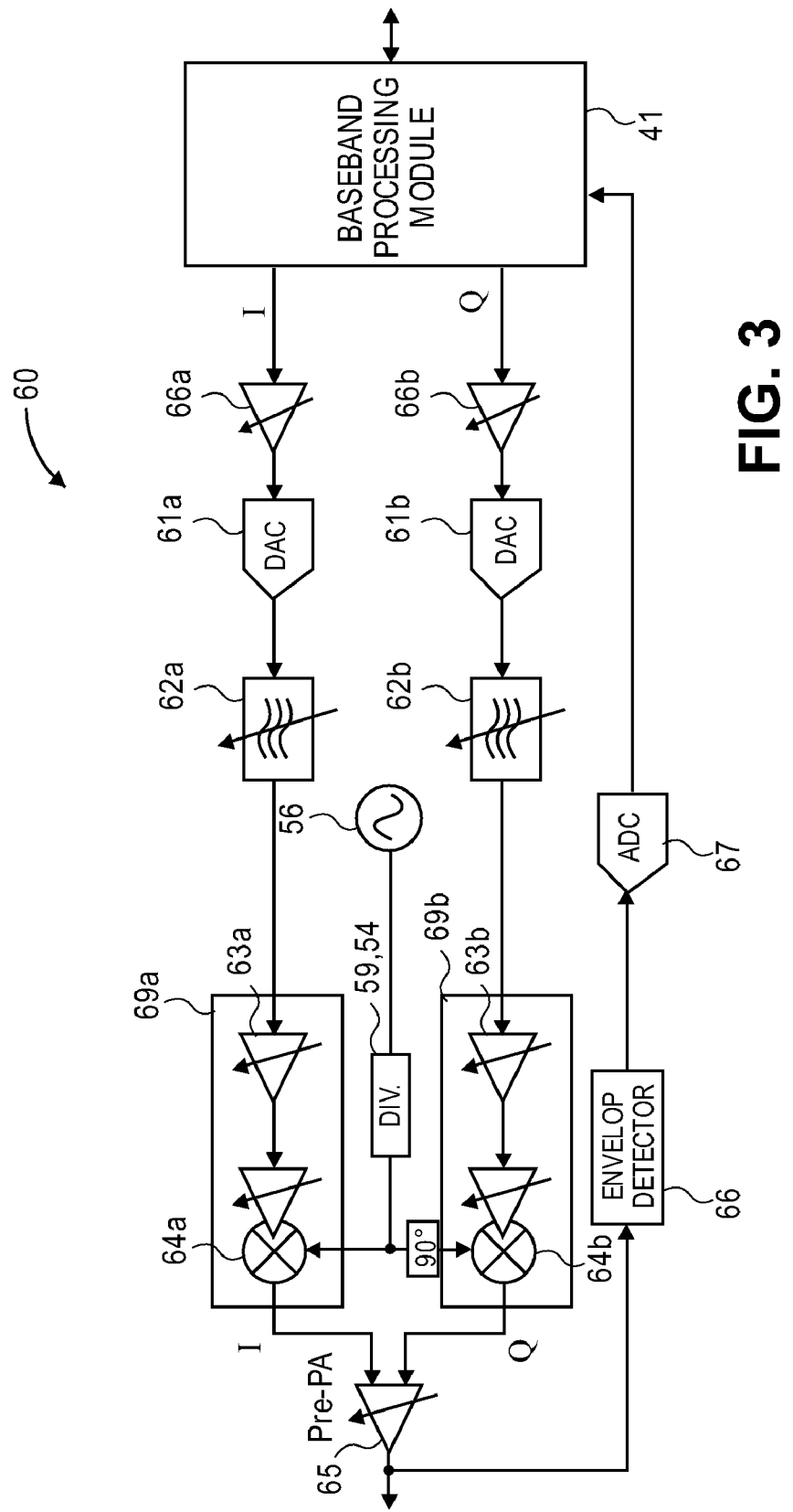
FIG. 3 is a block schematic diagram showing a more detailed circuitry for a portion of one transmitting path for the RF front end of FIG. 2.

FIG. 3 shows a circuit 60 that operates as part of a transmitting path for a RF front end. Circuit 60 may be implemented in the transmitter portion of transceiver stage 20 of FIG. 2. Circuit 60 may be implemented in other stages and devices as well. Furthermore, circuit 60 is illustrated having both the I and Q signal paths from baseband processing module 41. The outbound I and Q signals are coupled respectively through I and Q transmitting paths that include digital gain stages 66a-b, DACs 61a-b, filters 62a-b, mixing modules 69a-b and a pre-PA driver 65.

With reference to FIG. 2, DACs 61a-b are part of DAC 31 and filters 62a-b are part of filter module 32. Mixing modules 69a-b are part of either mixing module 33 or mixing module 34. Mixing module 69a includes an analog amplifier 63a and mixer 64a, while mixing module 69b includes an analog amplifier 63b and mixer 64b. In one embodiment, amplifiers 63a-b are programmable gain amplifiers (PGAs). The I and Q signal components from the output of respective mixing modules 64a, 64b are then combined when coupled to driver 65.

As shown in the embodiment of FIG. 3, components 66a-b, 62a-b, 63a-b, 64a-b and 65 are noted as variable gain components. It is to be noted that in other embodiments, only one or some of the components may be variable gain components while others may have fixed gain. In the embodiment of circuit 60, filters 62a-b, amplifier 63a-b, mixer 64a-b and driver 65 are analog components and, thus, their gains are adjusted by analog means. A variety of analog gain adjustment techniques and components may be implemented in these analog stages. For example, analog gain adjustments may include, but not limited to, switching in/out (or turning on/off) active components (such as transistors) or passive components (such as resistors). What is to be noted is that circuit 60 uses at least one analog stage where analog gain may be adjusted. As described below, the analog gain adjustments are employed to provide coarse gain adjustment for the transmitter portion of the RF front end. It is to be noted that although the various stages have analog gain adjustments, the control signal for making the gain adjustment may be done digitally. Thus, in one embodiment, bits or a digital control word may be used to switch in/out the various active and/or passive circuit components in the analog stages.

Digital gain stages 66a-b are shown on the digital domain side of DAC 61a-b and the gain adjustment is performed digitally. As described below, the adjustable digital gain provides a fine gain adjustment for the I and Q signals while still in the digital domain. It is to be noted that in the embodiment of circuit 60, digital gain stages 66a-b are shown disposed between baseband processing module 41 and DACs 61a-b. However, in actual practice the digital gain may be adjusted anywhere in the digital domain and such adjustment may occur within the baseband processing module 41. Gain stages 66a-b are shown in FIG. 3 for ease of understanding on how the digital fine gain adjustment is obtained in the digital domain, versus the analog gain adjustments which occur in the analog domain.

Circuit 60 also shows a local oscillator source to generate a local oscillator signal. With reference to FIG. 2, the LO source is PLL 56. A frequency divider, such as divider 54 or 59 of FIG. 2, is also shown to divide down the LO signal. The divided LO signal is coupled to I and Q mixers 64a-b, in which the LO signal is shifted 90 degrees for mixing with the Q component of the transmitted signal.

Furthermore, circuit 60 also includes an envelope detector 66 and ADC 67 to obtain a sample of the output signal from driver 65, detect the sample, convert the detected signal to digital form and couple the detected digital signal back to the baseband processing module 41. With reference to FIG. 2, envelope detector 66 is included within envelope detector 37 and ADC 67 may be ADC 43. Envelope detector 66 is used to capture a portion of the output signal envelope to determine a particular circuit parameter, such as output power. The fed back signal is then used to make the gain adjustments. When output power is the parameter of concern, envelope detector 66 detects the level of the output power and couples the information back to the baseband processing module 41. It is to be noted that although an envelope detector is shown in FIGS. 2 and 3, other detecting techniques may be used to detect or measure a particular circuit parameter which may then be used for making the gain adjustments. As noted, power measurement is a typical circuit parameter of interest for sampling the output.

Thus, circuit 60 illustrates various stages that have the capability of adjusting the gain of the transmitted signal. One or more analog stages may implement analog gain adjustment in the analog domain, while digital gain adjustment is performed in the digital domain. The analog gain adjustments that are available in the analog stages, such as the analog stages noted above, typically have a larger gain step between the incremental step changes as compared to digital gain steps. Therefore, although a number of analog gain levels (steps) may be present in an analog cell to adjust the analog gain of the circuit, finer gain adjustments are available with the digital gain control.

For example, in one embodiment for a transmitter of FIG. 2, an analog step (Astep) may be in 6 dB increments, approximately. That is, if an analog gain is initially at 0 dB, the next higher incremental gain step would be approximately 6 dB, and so on in 6 dB increments. As noted above, this result is generally due to the way analog gain circuitry operate in changing the gain. In contrast, since digital gain may be adjusted by changing a digital signal, smaller gain adjustment steps are much more simpler to obtain. Again, in one embodiment, this digital adjustment may be made within the baseband processing module itself and/or by digital gain stages 66*a*-*b*. In one embodiment, digital steps (Dstep) may be obtained in approximate increments of 0.05 dB. Thus, for circuit 60, Astep increments may be set at approximately 6 dB, while Dstep increments may be set at approximately 0.05 dB. These values are provided as an example and other embodiments may have other values. Accordingly, analog gain adjustments (changing gain by Astep) provides the coarse gain adjustment for the transmitted signal and digital gain adjustments (changing gain by Dstep) provides the fine gain adjustment.

As will be described below, one aspect of practicing the invention is to utilize digital gain adjustments with a given analog step, so that for a given Astep, Dstep adjustments with Dstep granularity may be used to adjust the overall gain. By utilizing Dstep gain adjustments with a given Astep, fine gain control may be used for the adjusting of the transmitter gain. For the particular example described above, an analog step change of 6 db (such as from 0 dB to 6 dB) is further adjusted by use of digital gain adjustments. The digital gain adjustment may provide finer gain steps between a particular analog gain step. For example, the digital gain may provide a finer adjustment (such as 1 dB) between each of the 6 dB Asteps. Furthermore, since the Astep change will most likely not be exactly at 6 dB (e.g. 5.9 dB or 6.2 dB), the digital gain may be used to compensate for this difference (e.g. +0.1 dB or −0.2 dB) to bring the actual gain to substantially 6.0 dB.

Figure 4:
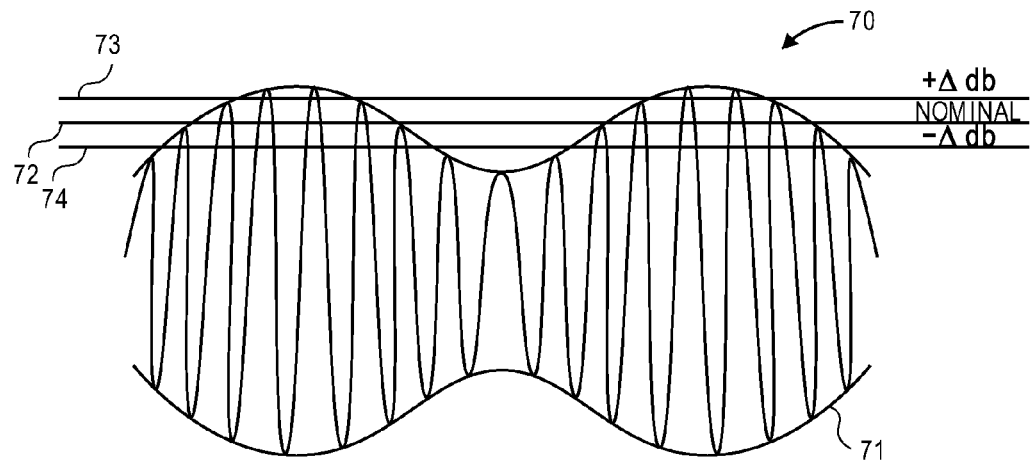
FIG. 4 is a waveform diagram showing an envelope detection technique in which nominal power values with specified tolerances are obtained for calibrating an analog gain step.

FIG. 4 shows one example of an output signal envelope that may be present at the output of driver 65 for detecting the particular circuit parameter, such as power. Graph 70 shows a signal envelope 71 that is being detected for output power. A nominal power level of the envelope is shown by line 72 with an acceptable accuracy of ±ΔdB. The nominal power level may correspond to the desired value of the output power for a specified gain value of the transmitter. In some instances, ±ΔdB may be established by a communication protocol or standard, such as WCDMA. For example, in one instance a protocol may set a required gain step at 1 dB with a ±ΔdB of ±0.5 dB. Accordingly, line 73 shows the acceptable upper level (+ΔdB) and line 74 shows the acceptable lower level (−ΔdB), in reference to a nominal level, shown by line 72.

Figure 5:
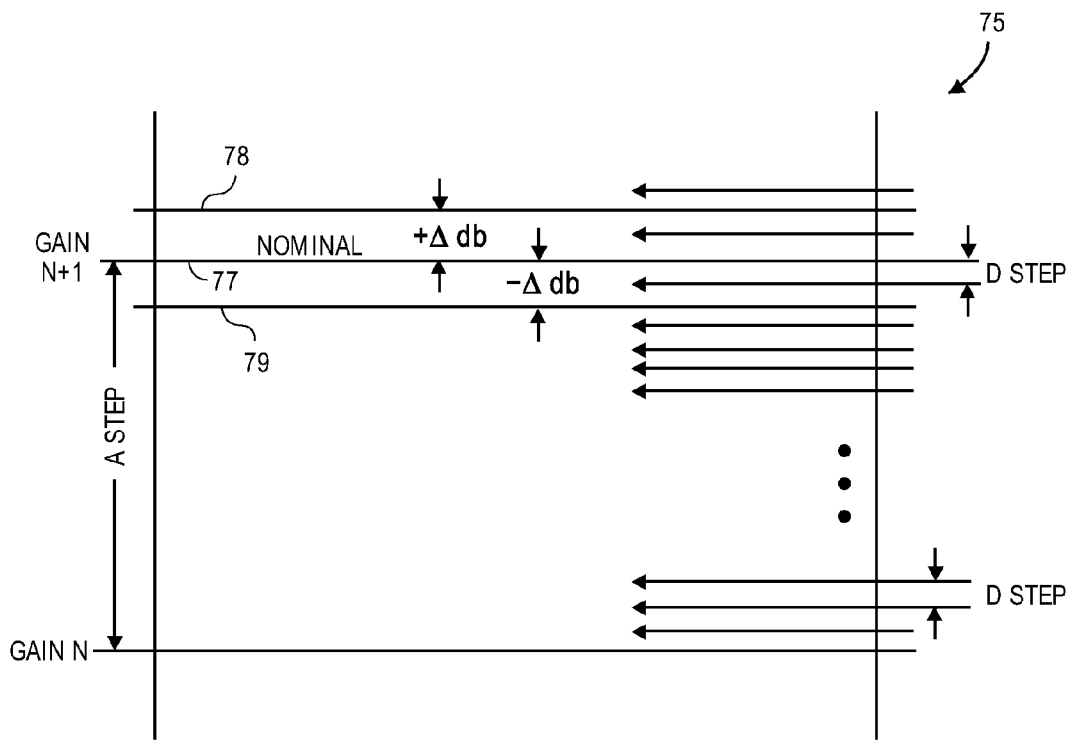
FIG. 5 is a diagram showing digital gain increments that are used with an analog gain step to set transmitter gain with the practice of the present invention.

FIG. 5 shows a graph 75 that illustrates how the Dstep gain adjustment is used with a given Astep level of a plurality of such Asteps, in order to set the gain level in the transmitter. Graph 75 illustrates an example Astep gain change from gain level N to gain level N+1. For example, with the above-described 6 dB incremental change in the analog gain, the Astep change from analog gain level N to gain level N+1 (line 77) represents a change of approximately 6 dB. Assuming that line 77 represents the gain value that corresponds to the nominal or specified power at a given Astep level, lines 78, 79 show the permissible accuracy range of ±ΔdB that the actual gain value may vary from the nominal. In one embodiment for practicing the invention, an approximate value of 0.1 dB may be selected for +ΔdB and −ΔdB.

Graph 75 also shows a gradient of Dsteps. The plurality of Dsteps may be used to adjust the gain level between gain level N and gain level N+1, as well as other levels, such as the next level N+2 (not shown). In one embodiment, in which the Dstep increment is set at approximately 0.05 dB, there would be approximately 120 Dsteps for a 6 dB Astep change. Similarly, there may be two Dsteps for the +ΔdB range and two Dsteps for the −ΔdB range. It is appreciated that the actual dB values noted herein for the Astep, Dstep and ΔdB are exemplary only and other embodiments may use other values. Thus, analog gain sets a particular coarse gain level for the transmitter and the digital gain is used to vary the gain, either plus or minus, in fine increments. The transmitter gain is set by the combination of the analog gain (having coarse adjustment) and the digital gain (having the fine adjustment).

In reference to FIG. 3, the analog stages of circuit 60 operate using the analog gain scheme, in which the incremental gain change is the Astep (such as from gain level N to gain level N+1, or vice versa). The digital gain adjustment, such as that provided by gain stages 66*a*-*b*, a given Astep range may be further adjusted by Dstep increments. Accordingly, circuit 60 is made operable to further adjust the transmitter gain level from that set by a given Astep adjustment by using the digital gain adjustment.

The digital gain adjustment may be used to provide various fine adjustments. In one adjustment technique, the digital gain may set gain levels within the Astep granularity. In this manner digital gain adjustments may be used to set the transmitter gain value between the Astep levels. For example, if the Astep granularity is approximately 6 dB, then the digital gain adjustment may be used to set gain levels between 0-6 dB in finer incremental values (such as 1 dB). Alternatively, the digital gain may also be used to fine adjust the analog gain so that the Astep level is substantially at a specified value. For example, if the Astep gain value is actually at 5.8 dB, instead of the specified 6 dB, then digital gain adjustment may be made to adjust the gain by +0.2 dB to bring the transmitter gain substantially closer to 6.0 dB.

In order to do bring the transmitter gain to the desired or specified value for a given Astep level, the analog front end is first set to a given operating gain level (such as gain level N+1). The analog gain is subsequently transitioned to another gain level (such as gain level N), and then the digital gain is adjusted to return the gain to the former operating gain level (gain level N+1). That is, once a particular analog gain level is set, a transition procedure is performed to use the digital gain at the given operating level, in which the digital gain allows the use of a smaller increment value noted as Dstep to fine adjust the gain at the operating gain level. It is to be noted that the described example herein references a change of analog gain from N+1 to N, but an equivalent technique may be employed for changing the gain from N to N+1, when N is set as the operating gain level. Thus, one or more of the analog gain steps may be fine adjusted by the digital gain adjustment.

Since the analog gain steps are generally calibrated at some point in the use of the analog front end (such as power measurement taken at manufacture), it is presumed that the analog gain steps are within tolerance of the acceptable accuracy (±ΔdB) when initially calibrated. Alternatively, other analog gain adjustments and calibrations may be used for setting the analog gain of an integrated circuit having analog gain stages in its RF front end. However, the analog gain values may change over time or even during normal operation of the integrated circuit if conditions change. Furthermore, if more than one variable analog stages are present, the stages may not track the gain correctly, thereby causing variations between/among the stages. For example, temperature, process and power supply variations may cause one or more analog operating levels in one or more analog cells to vary from the calibrated values. Thus, initially calibrated values may require corrections when operating the integrated circuit. Accordingly, Dstep adjustments are made to one or more Astep(s), in order to bring the operating Astep level closer to the desired or specified value.

Figure 6:
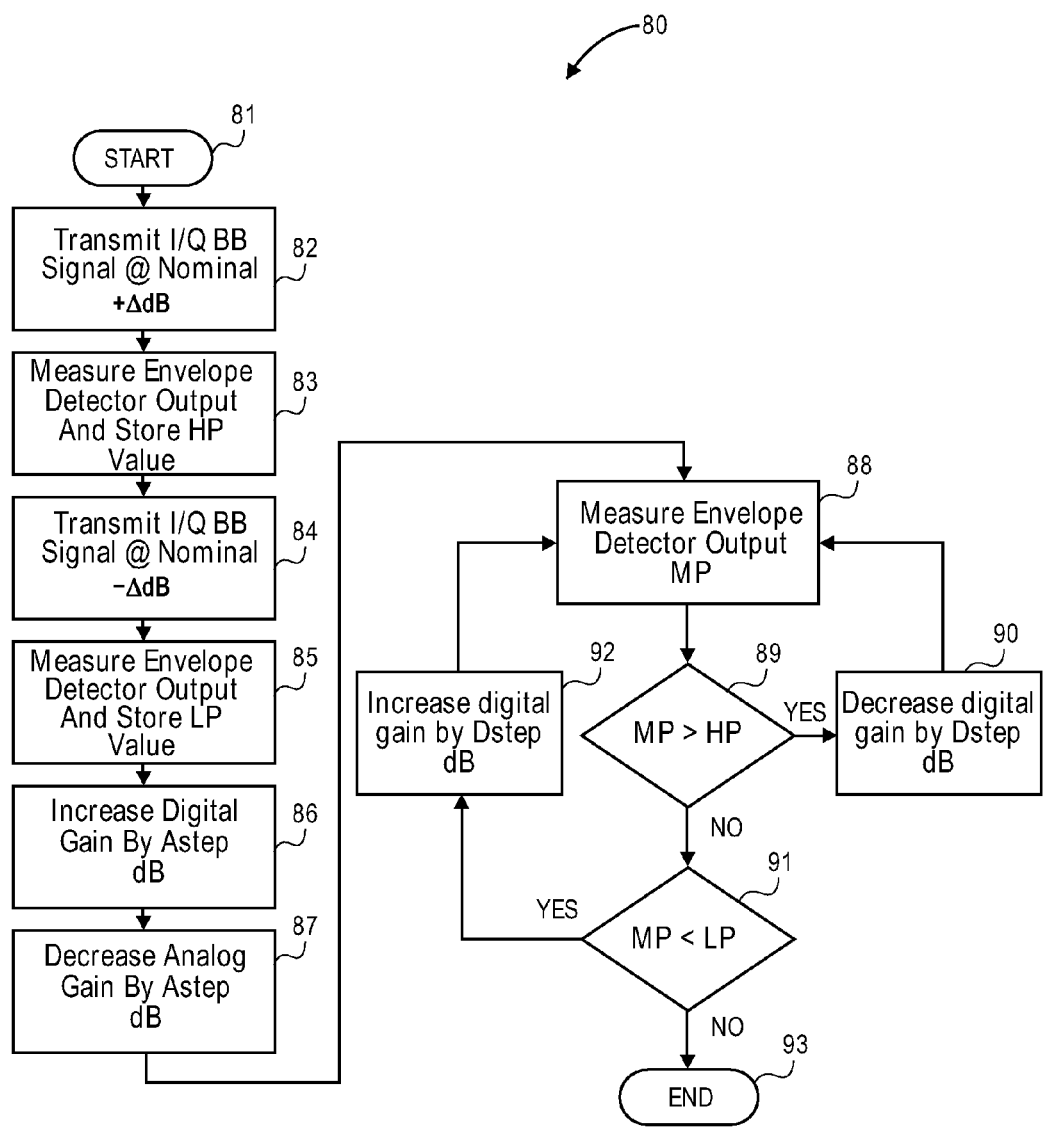
FIG. 6 shows one calibration technique to obtain analog gain step calibration with the practice of the present invention.

FIG. 6 shows one example technique for calibrating the gain with reference to a particular Astep. FIG. 6 shows a calibration procedure 80, which may be implemented within circuit 60. In one embodiment, calibration software that is operable with baseband processing module may perform the technique. In other embodiments, software, hardware and/or firmware operating with a transmitter may perform the function associated with calibration procedure 80. Prior to calibration procedure 80, the analog circuitry may have its analog gain calibrated for various analog gain values. The adjustment may be performed for an Astep of one analog cell or multiple cells. In one technique, the final gain adjusted output to the envelope detector may be the result of gain changes in one, some or all of the analog cell(s) that effect the gain change.

When digital gain is used to meet the required accuracy of the transmit gain control for a particular Astep, calibration procedure 80 is used. After calibration procedure 80 is initiated (block 81), an I/Q baseband (BB) calibration or test signal is transmitted from the baseband processing module 41 of FIG. 3 at a signal level that corresponds to the nominal plus ΔdB value that corresponds to line 73 of FIG. 4 (block 82). Envelope detector 66 is then used to detect the sampled output of driver 65 and this high power (HP) limit value is stored in baseband processing module 41 or a storage device associated with module 41, after conversion by ADC 67 (block 83). Separate I and Q test signals are used, since each I, Q branch of the analog circuitry has separate gain adjustments. Subsequently, another I/Q baseband (BB) calibration or test signal is transmitted from the baseband processing module 41 at a signal level that corresponds to the nominal minus ΔdB value that corresponds to line 74 of FIG. 4 (block 84). Envelope detector 66 is then used to detect the sampled output of driver 65 and this low power (LP) limit value is stored (block 85). Note that the procedure may be reversed, so that nominal minus ΔdB may be performed first. Also, note that the above procedure may be performed at initial calibration of the integrated circuit and the HP and LP values for a given Astep may be stored for later use.

Then, the digital gain is increased by the analog gain level increment Astep (block 86), while the analog gain is decreased by Astep (block 87). Note that in reference to FIG. 5, this increase in the digital gain by Astep while decreasing the analog gain by Astep, results in the signal at gain level N+1 decreasing to gain level N due to the analog gain decrease, but returning to gain level N+1 with the increase of the digital gain by Astep. It is to be noted that the order of performing the analog and gain adjustments may be reversed or even done simultaneously.

If the digital gain steps correspond exactly with the analog gain step then the measured parameter, such as the output power, by the envelope detector would be substantially the same, or at least within acceptable limits of ΔdB. However, this may not be the case. Accordingly, calibration procedure 80 further sends a BB signal at the supposed nominal power for the gain level and envelope detector 66 again obtains an output sample of the measured power (block 88). If the measured power (MP) is greater than the allowed HP limit (block 89), which corresponds to line 78 of FIG. 5, the digital gain is decreased by a Dstep (block 90) and the measurement taken again. This is done until MP is no longer greater than HP. Similarly, if the measured power MP is less than the allowed LP limit (block 91), which corresponds to line 79 of FIG. 5, the digital gain is increased by a Dstep (block 92) and the measurement taken again. This is done until MP is no longer less than LP. At the end (block 93), the gain level is calibrated to the previous Astep power value (N+1 in the example), but now the gain step increments are provided by the digital gain increments.

Performing the calibration procedure using the digital gain steps allows for a finer adjustment of the operating level of the transmitter, when digital gain is used in place of a given analog gain step. The smaller granularity of the digital steps allows for a finer gain control over the particular gain level, since gain adjustments may be performed digitally using smaller gain steps over analog gain steps. Gain values within the earlier defined analog gain step may now be controlled in smaller digital gain increments. The use of the digital gain over an analog gain step may be performed for one, some or all of the analog gain steps that are employed in a given analog stage or stages.

The gain calibration procedure may be performed at manufacture when a chip is being manufactured, during initialization (such as during start-up of the chip), while performing diagnostics or during actual use, whenever digital gain is to be substituted for one or more analog gain steps. Since the HP and LP values are stored, any MP during operation may be compared to the stored HP and/or LP values and adjusted accordingly. Once the gain calibration is performed, the digital adjustment values at the given calibration level or levels are noted and stored, such as in memory, for later use. The stored calibration compensation values are then used to compensate the deviation of the analog gain from a substantially ideal value whenever the corresponding analog gain step is selected during normal operation. In this manner, deviations of the analog gain value at a particular gain step may be compensated by the digital gain to maintain a substantially ideal gain value when the transmitter is in operation and the particular gain step is selected.

Furthermore, since tighter controls may be employed with digital gain control, a more stable performance may be obtained over temperature, process and/or power supply variations for an integrated circuit. The analog/digital gain scheme described above, along with the described calibration technique may be implemented in a variety of analog circuits and in one embodiment, the technique is implemented in a transmitter section of a mobile cellular transmitter.

Thus, a scheme to implement coarse analog gain and fine digital gain adjustments in an RF circuit and a gain step calibration procedure to calibrate the transmitter gain, when the digital gain adjustment is used for an analog gain step, is described.

As may be used herein, the terms "substantially" and "approximately" provides an industry-accepted tolerance for its corresponding term and/or relativity between items. Such an industry-accepted tolerance ranges from less than one percent to fifty percent and corresponds to, but is not limited to, component values, integrated circuit process variations, temperature variations, rise and fall times, and/or thermal noise. Such relativity between items ranges from a difference of a few percent to magnitude differences. As may also be used herein, the term(s) "coupled" and/or "coupling" includes direct coupling between items and/or indirect coupling between items via an intervening item (e.g., an item includes, but is not limited to, a component, an element, a circuit, and/or a module) where, for indirect coupling, the intervening item does not modify the information of a signal but may adjust its current level, voltage level, and/or power level. As may further be used herein, inferred coupling (i.e., where one element is coupled to another element by inference) includes direct and indirect coupling between two items in the same manner as "coupled to". As may even further be used herein, the term "operable to" indicates that an item includes one or more of power connections, input(s), output (s), etc., to perform one or more its corresponding functions and may further include inferred coupling to one or more other items.

Furthermore, the term "module" is used herein to describe a functional block and may represent hardware, software, firmware, etc., without limitation to its structure. A "module" may be a circuit, integrated circuit chip or chips, assembly or other component configurations. Accordingly, a "processing module" may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on hard coding of the circuitry and/or operational instructions and such processing device may have accompanying memory. A "module" may also be software or software operating in conjunction with hardware.

The embodiments of the present invention have been described above with the aid of functional building blocks illustrating the performance of certain functions. The boundaries of these functional building blocks have been arbitrarily defined for convenience of description. Alternate boundaries could be defined as long as the certain functions are appropriately performed. One of ordinary skill in the art may also recognize that the functional building blocks, and other illustrative blocks, modules and components herein, may be implemented as illustrated or by discrete components, application specific integrated circuits, processors executing appropriate software and the like or any combination thereof.

We claim:

1. A method comprising:
   determining an operating gain level based on one of a plurality of analog gain steps that are used to adjust analog gain levels for an analog circuit;
   changing analog gain to adjust analog gain to another analog gain level for the analog circuit;
   setting digital gain to return gain level for the analog circuit back to the operating gain level, the operating gain level for the analog circuit now being controlled by digital gain steps of smaller incremental steps as compared to the analog gain steps, in order to utilize digital gain control with finer gain adjustment over analog gain adjustment; and
   calibrating digital gain at the operating gain level based on comparison with an analog gain measurement obtained at the operating gain level previous to changing the analog gain.

2. The method of claim 1, further including measuring an output from the analog circuit at the operating gain level using an envelope detector to measure a circuit parameter to calibrate the digital gain.

3. The method of claim 1, further including measuring output power from the analog circuit at the operating gain level using an envelope detector to calibrate the digital gain.

4. The method of claim 1, wherein the calibrating digital gain includes measuring a circuit parameter of the analog circuit at the operating level by setting the analog gain to the operating level to obtain a first measurement, measuring the circuit parameter again when digital gain is set to return the gain level to the operating level to obtain a second measurement and comparing the second measurement to the first measurement for calibration.

5. The method of claim 4, wherein the calibrating the digital gain further includes adjusting the digital gain in fine increments to bring the digital gain within a predetermined limit, if the second measurement is not within the predetermined limit from the first measurement.

6. The method of claim 5, wherein determining the operating gain level is for an analog front end of a transmitter, in which the digital gain is calibrated and utilized for the analog gain at the operating gain level.

7. A method comprising:
   determining an operating gain level based on one of a plurality of analog gain steps that are used to adjust analog gain levels for an analog circuit;
   transmitting a first baseband signal to the analog circuit corresponding to an upper acceptable limit for analog gain at the operating gain level;
   obtaining a first measurement at an output of the analog circuit based on the first baseband signal;
   transmitting a second baseband signal to the analog circuit corresponding to a lower acceptable limit for analog gain at the operating gain level;
   obtaining a second measurement at the output of the analog circuit based on the second baseband signal;
   changing analog gain to adjust analog gain to another analog gain level for the analog circuit and adjusting digital gain to return gain level for the analog circuit back to the operating gain level, the operating gain level for the analog circuit now being controlled by digital gain steps of smaller incremental steps as compared to the analog gain steps, in order to utilize digital gain control with finer gain adjustment over analog gain adjustment;
   transmitting a third baseband signal to the analog circuit corresponding to having the digital gain set to operate at the operating gain level;
   obtaining a third measurement at the output of the analog circuit based on the third baseband signal;
   comparing the third measurement to not exceed the acceptable limits set by the first and second measurements and if the third measurement exceeds one of the acceptable limits, adjusting digital gain and transmitting the third baseband signal to obtain subsequent measurements until the third baseband signal resides within the acceptable limits set by the first and second measurements.

8. The method of claim 7, wherein determining the operating gain level for the analog circuit includes determining the operating gain level for the analog circuit which resides within a radio frequency front end of a wireless device.

9. The method of claim 7, wherein determining the operating gain level for the analog circuit includes determining the operating gain level for the analog circuit which resides within a transmitter portion of a radio frequency front end of a wireless device.

10. The method of claim 7, wherein determining the operating gain level for the analog circuit includes determining the operating gain level for the analog circuit which resides within a transmitter portion of a radio frequency front end of a cellular device utilizing WCDMA communication protocol.

11. The method of claim 7, wherein determining the operating gain level for the analog circuit includes determining the operating gain level for the analog circuit which resides within a radio frequency (RF) front end of a wireless device and wherein obtaining first, second and third measurements are achieved by use of an envelope detector to detect a circuit parameter of the RF front end.

12. The method of claim 7, wherein determining the operating gain level for the analog circuit includes determining the operating gain level for the analog circuit which resides within a radio frequency (RF) front end of a wireless device and wherein obtaining first, second and third measurements are achieved by use of an envelope detector to detect output power of the RF front end.

13. A method comprising:
   changing analog gain of an analog circuit of a radio frequency (RF) front end of a wireless device to adjust analog gain to another analog gain level set by one of a plurality of analog gain steps for the analog circuit;

adjusting digital gain of a baseband processor module to return gain level for the analog circuit back to the operating gain level, the operating gain level for the analog circuit now being controlled by digital gain steps of smaller incremental steps as compared to the analog gain steps, in order to utilize digital gain control with finer gain adjustment over analog gain adjustment;

transmitting a baseband signal to the analog circuit corresponding to having the digital gain set to operate at the operating gain level;

obtaining a measurement at the output of the analog circuit based on the third baseband signal;

comparing the measurement to not exceed stored acceptable limits set by calibration, in which the calibration includes:

(i) transmitting a first test signal to the analog circuit corresponding to an upper acceptable limit for analog gain at the operating gain level;

(ii) obtaining a first test measurement at an output of the analog circuit based on the first test signal;

(iii) transmitting a second test signal to the analog circuit corresponding to a lower acceptable limit for analog gain at the operating gain level;

(iv) obtaining a second test measurement at the output of the analog circuit based on the second test signal; and (v) storing the first and second test measurements;

comparing the output measurement to not exceed the acceptable limits set by the first and second test measurements; and adjusting digital gain and retransmitting the baseband signal to obtain subsequent measurements until the baseband signal resides within the acceptable limits set by the first and second test measurements, if the output measurement exceeds one of the acceptable limits.

14. The method of claim 13, wherein obtaining the output measurement is achieved by use of an envelope detector to detect a circuit parameter of the RF front end.

15. The method of claim 13, wherein obtaining the output measurement is achieved by use of an envelope detector to detect output power of the RF front end.

16. An apparatus comprising:

a digital gain stage to adjust digital gain;

an analog circuit having an analog gain stage to adjust analog gain, in which the analog circuit is coupled to the digital gain stage; and a detector to measure gain at an output of the analog circuit and to feed back a signal indicative of the measured gain, wherein an operating gain level is based on one of a plurality of analog gain steps that are used to adjust analog gain levels for the analog circuit, in which a particular analog gain step is calibrated by:

changing analog gain to adjust analog gain from the operating gain level to another analog gain level for the analog circuit;

setting digital gain to return gain level for the analog circuit back to the operating gain level, the operating gain level for the analog circuit now being controlled by digital gain steps of smaller incremental steps as compared to the analog gain steps, in order to utilize digital gain control of the digital gain stage that has finer gain adjustment over analog gain adjustment; and calibrating digital gain at the operating gain level based on comparison with an analog gain measurement obtained at the operating gain level previous to changing the analog gain.

17. The apparatus of claim 16, wherein the detector is an envelope detector to detect a circuit parameter at the output of the analog circuit.

18. The apparatus of claim 16, wherein the detector is an envelope detector to detect output power at the output of the analog circuit.

* * * * *